(12) United States Patent
McClure

(10) Patent No.: US 6,556,057 B2
(45) Date of Patent: Apr. 29, 2003

(54) NOISE SUPPRESSION CIRCUITRY AND METHOD

(75) Inventor: David C. McClure, Carrollton, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 09/846,523

(22) Filed: Apr. 30, 2001

(65) Prior Publication Data

US 2002/0158684 A1 Oct. 31, 2002

(51) Int. Cl.$^7$ ................................................ H03L 7/00
(52) U.S. Cl. ...................................................... 327/143
(58) Field of Search ................................ 327/143, 198, 327/205

(56) References Cited

U.S. PATENT DOCUMENTS

| 4,245,150 A | * | 1/1981 | Driscoll et al. ............. 327/143 |
| 4,887,071 A | * | 12/1989 | Virdee ........................ 307/328 |
| 4,931,748 A |   | 6/1990 | McDermott et al. ............ 331/1 |
| 5,343,085 A | * | 8/1994 | Fujimoro et al. ............ 327/143 |
| 5,446,403 A | * | 8/1995 | Witkowski ................... 326/94 |
| 5,739,708 A | * | 4/1998 | LeWalter .................... 327/142 |
| 6,222,392 B1 | * | 4/2001 | Guo et al. ................... 327/198 |

* cited by examiner

Primary Examiner—Jeffrey Zweizig
(74) Attorney, Agent, or Firm—Lisa K. Jorgenson; Andre Szuwalski

(57) ABSTRACT

A circuit and method are disclosed for monitoring the voltage level of an electrical signal, such as an unregulated power supply. The circuit includes a comparator that compares the electrical to the voltage reference and generates an output having a value that is based upon the comparison. A oscillation suppression circuit receives the output of the comparator and generates an output signal that follows the output of the comparator once the output of the comparator remains stable and in the same logic state for a predetermined of time.

40 Claims, 2 Drawing Sheets

NOISE SUPPRESSION CIRCUITRY AND METHOD

BACKGROUND OF THE INVENTION

1. Technical Field of the Invention

The present invention relates to monitoring electrical signals, and particularly to a circuit and method for monitoring voltage supply levels provided to an integrated circuit chip.

2. Description of the Related Art

Advancements in the semiconductor industry have led to increased demands for circuit performance. In an effort to more tightly control operating conditions so as to meet the increased demands placed on integrated circuitry, some existing integrated circuitry monitor power supply levels, such as the voltage supply level from an unregulated power supply, so as to detect instances in which the power supply level falls below a predetermined level, such as a predetermined minimum voltage level.

One existing power supply monitor circuit is shown in FIG. 1. An unregulated voltage is generated from a voltage divider of an unregulated power supply. A comparator C compares the unregulated voltage to a predetermined voltage reference Vref. The comparator C asserts a power fail signal OUT in the event the unregulated voltage falls below the predetermined voltage reference Vref. The power fail signal OUT may be, for example, provided to a processor or other controller device (not shown). Upon the power fail signal OUT being asserted, the processor/controller device may take appropriate remedial action, such as switching to a battery backup supply.

One problem with existing power supply monitor circuits, such as the existing power supply monitor circuitry of FIG. 1, is in monitoring a relatively slowly changing unregulated power supply. For instance, a slowly changing unregulated voltage at or near the predetermined reference voltage Vref may cause comparator C to oscillate. As can be seen, oscillation of comparator C may cause the corresponding processor/controller device to attempt repeated remedial measures and/or otherwise disrupt the operation of the system. Based upon the foregoing, there is a need for a monitor circuit that substantially suppresses oscillation effects.

SUMMARY OF THE INVENTION

Embodiments of the present invention overcome shortcomings in existing power supply monitor circuits and satisfy a significant need for a substantially oscillation-free monitor circuit. A monitor circuit according to first embodiment of the present invention includes a comparator for comparing an electrical signal, such as a power supply signal, with a voltage reference signal and generating an output based upon the comparison. The monitor circuit further includes a first circuit having an input coupled to the output of the comparator and an output signal that is driven to a first logic state upon the output of the comparator being in the same logic state substantially entirely over a predetermined period of time. In this way, the output of the monitor circuit will not transition to the first logic state until the output of the comparator is stable in the logic state over the predetermined time period, thereby preventing oscillation of and/or noise appearing on the output signal of the monitor circuit.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE PREFERRED EXEMPLARY EMBODIMENTS

The present invention will now be described more fully hereinafter with reference to the accompanying drawings in which a preferred embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 1:
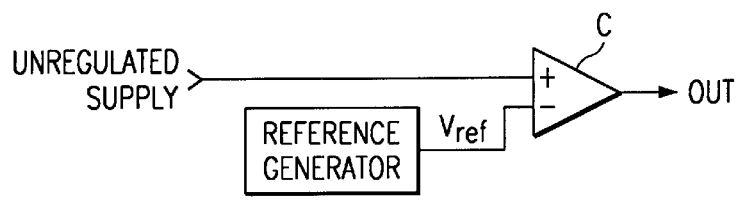
FIG. 1 is a top level circuit diagram of an existing power supply monitor circuit.
Figure 2:
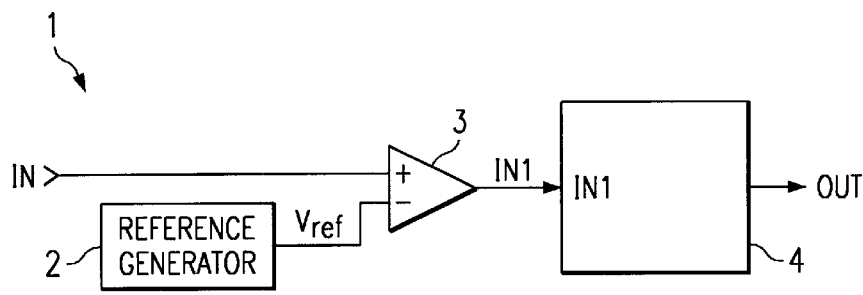
FIG. 2 is a top level circuit diagram of a monitor circuit according to an embodiment of the present invention.
Figure 3:
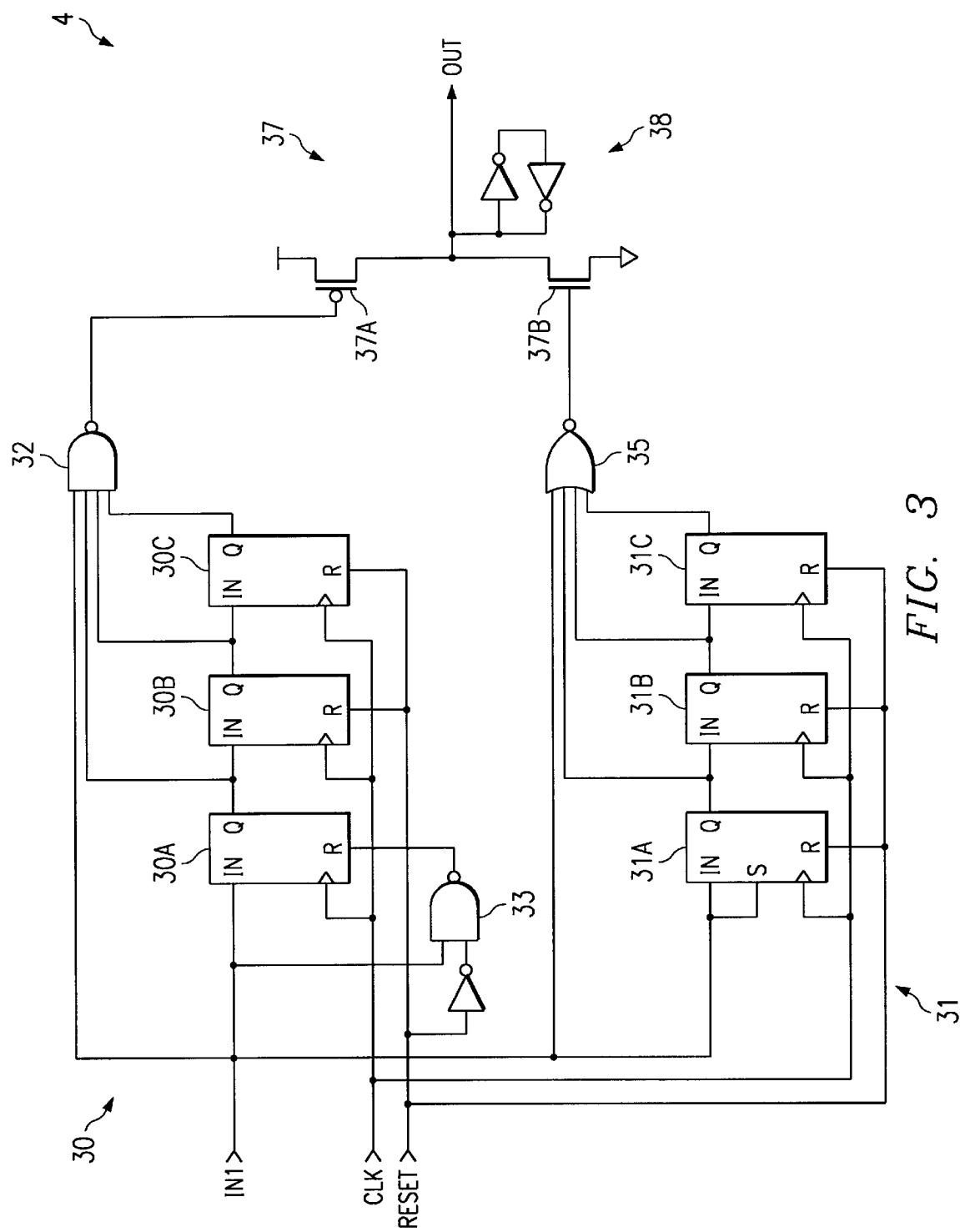
FIG. 3 is a circuit diagram of a noise suppression circuit of the monitor circuit of FIG. 2.

Referring to FIGS. 2–3, there is shown a monitor circuit 1 according to embodiments of the present invention. Monitor circuit 1 monitors the voltage level of an electrical input signal, such as an unregulated power supply, and generates an output signal indicative of the voltage level of the electrical input signal relative to a predetermined voltage reference Vref. Monitor circuit 1 may be an integrated circuit on an integrated circuit chip.

Monitor circuit 1 may include a reference generator circuit 2 which generates voltage reference Vref. Reference generator circuit 2 may be implemented in any of a number of known ways. Alternatively, monitor circuit 1 may instead receive voltage reference Vref that is externally generated.

Monitor circuit 1 further includes a comparator circuit 3 which receives voltage reference Vref and an input signal IN, which may be an unregulated supply signal as explained above. As shown in FIG. 2, input signal IN is be coupled to the non-inverting input of comparator circuit 3 and voltage reference Vref is coupled to the inverting input of comparator circuit 3. It is understood, however, that input signal IN may be coupled to the inverting input comparator circuit 3 and voltage reference Vref may be coupled to the non-inverting input thereof. The output of comparator circuit 3 is driven to a voltage level corresponding to a logic high level and a logic low level based upon the voltage level of input signal IN relative to voltage reference Vref.

As stated above, existing monitor circuits have been seen to oscillate when the voltage of a power supply changes slowly around the voltage reference to which the power supply voltage is compared. Because the output signal generated by comparator circuit 3 may occasionally oscillate, monitor circuit 1 further includes a circuit 4 that substantially suppresses oscillation or other noise appearing on the output of comparator circuit 3. Circuit 4 receives the output of comparator circuit 3 and generates output signal OUT based upon the logic level of comparator circuit 3. In particular, output signal OUT mirrors the output of comparator circuit 3 when the output of comparator circuit -3 reaches and remains stable in a logic state for a predetermined period of time. In this way, output signal OUT does not change state when comparator circuit 3 oscillates.

FIG. 3 illustrates an exemplary circuit diagram of circuit 4 according to an embodiment of the present invention. In this embodiment, circuit 4 utilizes a pair of shift register circuits. A first shift register circuit 30 is adapted to de-assert an output signal thereof when the output of comparator circuit 3 has been in the logic high state for a predetermined period of time being three clock periods of clock signal CLK. First shift register circuit 30 includes a plurality of cascaded flip flop elements 30A, 30B, and 30C. The output of flip flop element 30A is coupled to the input of flip flop element 30B, and the output of flip flop element 30B is coupled to the input of flip flop element 30C. The input of flip flop element 30A is coupled to the output of comparator circuit 3. Logic NAND gate 32 receives as inputs the output of each flip flop element 30A–30C and the output of comparator circuit 3. As can be seen, the output of logic gate 32 is driven to the logic low state when each flip flop element 30A–30C and the output of comparator circuit 3 are in the logic high state.

Each flip flop element 30A–30C of first shift register circuit 30 has an active high, asynchronous reset input for asynchronously placing the flip flop element in a logic low state. The asynchronous reset input of flip flop elements 30B and 30C are coupled to a reset signal RESET. The asynchronous reset input of flip flop element 30A is driven by a logic NAND gate 33 that itself receives as inputs the output of comparator circuit 3 and reset signal RESET.

A second shift register circuit 31 is adapted to deassert an output signal thereof when the output of comparator circuit 3 has been in the logic low state for a predetermined period of time being three clock periods of clock signal CLK. Second shift register circuit 31 includes a plurality of cascaded flip flop elements 31A, 31B, and 31C. The output of flip flop element 31A is coupled to the input of flip flop element 31B, and the output of flip flop element 31B is coupled to the input of flip flop element 31C. The input of flip flop element 31A is coupled to the output of comparator circuit 3. Logic NOR gate 35 receives as inputs the output of each flip flop element 31A–31C and the output of comparator circuit 3. As can be seen, the output of logic gate 35 is driven to the logic low state whenever at least one flip flop element 31A–31C and the output of comparator circuit 3 is in the logic high state.

Each flip flop element 31A–31C of second shift register circuit 31 has an active-high asynchronous reset input for asynchronously placing the flip flop element in a logic low state. The asynchronous reset input of flip flop elements 31A–31C are coupled to reset signal RESET. Flip flop element 31A includes an active high asynchronous set input for asynchronously placing flip flop element 31A in the logic high state. The asynchronous set input of flip flop element 31A is coupled to the output of comparator circuit.

It is understood that the first and second shift register circuits may each have any of a number of flip flop elements, and that the shift register circuits are shown in FIG. 3 as having three flip flop elements for exemplary purposes only. It is further understood that first and second shift register circuits may have a different number of flip flop elements relative to each other.

Circuit 4 of monitor circuit 1 further includes an output driver 37 having a high side drive transistor 37A and a low side drive transistor 37B. The control terminal of high side transistor 37A is coupled to the output of logic gate 32. The control terminal of low side transistor 37B is coupled to the output of logic gate 35. As can be seen, output signal OUT is driven by output driver 37 only when one of high side and low side transistors is activated. In order to drive output signal OUT when high and low side transistors are deactivated, a latch circuit 38 is coupled to output signal OUT.

The operation of monitor circuit 1 according to the exemplary embodiment of the present invention will be described with reference to the waveform diagram of FIG. 4. Initially, it is assumed that input signal IN is substantially greater than voltage reference Vref (i.e., before time T1 in FIG. 4). This results in the output of comparator circuit 3 being driven to the high state. After a first clock pulse, flip flop element 30A is placed in the logic high state. Flip flop element 30B is set to the high state following the second clock pulse on signal CLK and flip flop element 30C is set to the high state following the third occurrence of the clock pulse on signal CLK. Following the third pulse appearing on clock signal CLK and with the output of comparator circuit 3 remaining in the high logic state, logic NAND gate 32 is driven to the low logic state, which activates high side transistor 37A so as to pull output signal OUT towards a voltage corresponding to the high logic level. During this time, a logic high is shifted through flip flop elements 31A–31C of second shift register circuit 31, which drives the output of logic NOR gate 35 to the logic low state so as to deactivate low side transistor 37B of driver circuit 37.

Figure 4A:
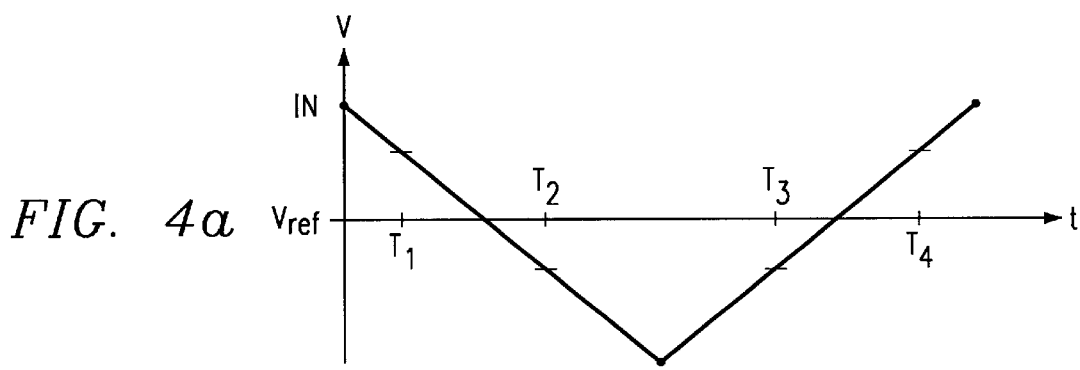
FIG. 4 is a timing diagram illustrating the operation of the monitor circuit of FIG. 2.
Figure 4B:
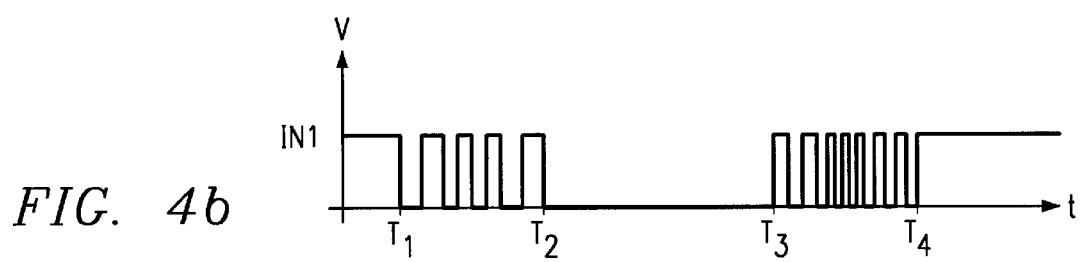
Figure 4C:
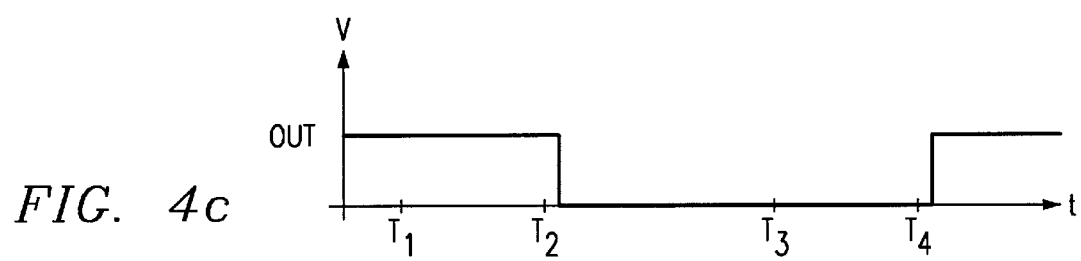

As the voltage on input signal IN falls to around voltage reference Vref (i.e., between times T1 and T2 as shown in FIG. 4), the output of comparator circuit 3 may oscillate between logic high and logic low states. When the output of comparator circuit 3 initially falls to the logic low state during this period of oscillation, flip flop element 30A is reset (i.e., placed in the logic low state). In addition, logic NAND gate 32 is driven to the high state, which at least temporarily turns of f high side transistor 37A. However, because latch circuit 38 keeps output signal OUT in the logic state to which output signal OUT is last driven, output signal OUT is maintained in the logic high state.

During the time when the output of comparator circuit 3 oscillates between logic high and logic low states, flip flop element 30A is frequently reset, which causes a logic low state to shift through first shift register circuit 30, thereby deactivating high side transistor 37A so that output signal OUT is not driven to the logic high state. Similarly, flip flop element 31A is frequently set, which causes a logic high state to shift through second shift register circuit 31, thereby keeping low side transistor 37B deactivated and output signal OUT not driven to the logic low state. Consequently during this first period of oscillation of compare circuit 3, latch circuit 38 maintains output signal OUT in the logic high state.

Next, the voltage appearing on input signal IN falls sufficiently below voltage reference Vref so that comparator circuit 3 no longer oscillates and its output signal is instead stable and driven to the logic low state. This is represented as the time between times T2 and T3 in FIG. 4. With the output of comparator circuit 3 in the logic low state, flip flop element 30A is continuously reset and/or maintained in the logic low state. This logic low state is shifted to flip flop elements 30B and 30C during successive clock pulses appearing on clock signal CLK. With flip flop element 30A (as well as flip flop elements 30B and 30C) in the logic low state, the output of logic NAND gate 32 is maintained in the logic high state, which thereby keeps high side transistor 37A deactivated.

With the output of comparator circuit 3 in the logic low state, flip flop element 31A is continuously maintained in the logic low state. This logic low is shifted to flip flop elements 31B and 31C during successive clock pulses appearing on clock signal CLK. With flip flop elements 31A, 31B and 31C and the output of comparator circuit 3 simultaneously in the logic low state, the output of logic NOR gate 35 is driven to the logic high state, which activates low side transistor 37B so that output signal OUT is driven to the low logic state.

Next, the voltage appearing on input signal IN rises to be sufficiently close to voltage reference Vref so as to cause comparator circuit 3 to oscillate for a second time period. This may be represented as the time between times T3 and T4 of FIG. 4. Similar to the first occurrence of comparator circuit 3 oscillating, this second oscillation of comparator circuit 3 causes both high side transistor 37A and low side transistor 37B to be deactivated. Consequently during this second period of oscillation, latch circuit 38 maintains output signal OUT in the logic low state (i.e., the logic state to which output signal OUT was last driven by driver circuit 37).

Next, the voltage appearing on input signal IN rises sufficiently above voltage reference Vref so that comparator circuit 3 no longer oscillates and instead its output is stable and driven to the logic high state. This is represented as the period after time T4 in FIG. 4. This sets flip flop element 30A in the logic high state, which is shifted in flip flop elements 30B and 30C upon successive clock pulses appearing on clock signal CLK. Once all flip flop elements 30A–30C are in the logic high state and with the output of comparator circuit 3 remaining in the logic high state, logic NAND gate 32 is driven to the logic low state, which activates high side transistor 37A so as to drive output signal OUT to the logic high state. During this time period, flip flop elements 31A–31C drive logic NOR gate 35 in the logic low state so as to maintain low side transistor 37B deactivated.

As can be seen in the timing diagram of FIG. 4, output signal OUT does not transition between logic states until the output of comparator circuit 3 no longer oscillates and instead reaches a stable logic state for a period of time amounting to three clock periods of clock signal CLK. Monitor circuit 4 thereby substantially suppresses oscillation and/or noise appearing on the output of comparator circuit 3. This can be seen as monitor circuit 1 having hysteresis in that the output signal OUT will transition to the low state when input signal IN falls below the lowest voltage level at which comparator circuit 3 oscillates, and will transition to the logic high state when input signal IN rises above the highest voltage level that causes comparator circuit 3 to oscillate. It is understood that this hysteresis effect may be removed by only using one of first and second shift register circuits. For example, first shift register circuit 30 may be removed with the inputs of logic NAND gate 32 being coupled to the outputs of flip flop elements 31A–31C. However, a hysteresis-free monitor circuit will result in transitions to one of the two logic states prior to comparator circuit 3 being stable.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A power supply detect circuit, comprising:
a comparator for comparing a power supply signal and a reference voltage signal and generating an output signal based upon the comparison; and
a first circuit having an input coupled to the output of the comparator and an output signal driven to a logic state based upon the output of the comparator being in the same logic state substantially entirely over a plurality of consecutive time periods, the first circuit drives the output signal thereof to a first logic state upon the output of the comparator being in one of the first logic state and a second logic state substantially entirely over a plurality of consecutive time periods, and to the second logic state upon the output of the comparator being in the other of the first logic state and the second logic state substantially entirely over a plurality of consecutive time periods.

2. The power supply detect circuit of claim 1, wherein the number of consecutive time periods at which the output of the comparator is in the first logic state in order for the output signal to be driven to the first logic state is the same as the number of consecutive time periods at which the output of the comparator is in the second logic state in order for the output signal to be driven to the second logic state.

3. The power supply detect circuit of claim 1, wherein:
the first circuitry maintains the output signal thereof in the first logic state until the output of the comparator is in the second logic state substantially entirely over a plurality of consecutive time periods, and maintains the output signal in the second logic state until the output of the comparator is in the first logic state substantially entirely over a plurality of consecutive time periods.

4. A power supply detect circuit, comprising:
a comparator for comparing a power supply signal and a reference voltage signal and generating an output signal based upon the comparison; and
a first circuit having an input coupled to the output of the comparator and an output signal driven to a first logic state upon the output of the comparator being in the same logic state substantially entirely over a plurality of consecutive time periods, wherein the first circuit comprises; shift register circuitry.

5. The power supply detect circuit of claim 4, wherein the shift register circuitry comprises:
a plurality of flip flop elements connected in a chain of flip flop element, a first flip flop element in the chain including a clocked synchronous input and an unclocked asynchronous input, the output of the comparator being coupled to the clocked and unclocked inputs of the first flip flop element.

6. The power supply detect circuit of claim 5, wherein the unclocked input of the first flip flop element comprises an asynchronous reset input.

7. The power supply detect circuit of claim 5, wherein the unclocked input of the first flip flop element comprises an asynchronous set input.

8. The power supply detect circuit of claim 5, wherein the output of the first circuit is based upon a logic state of each flip flop element in the shift register circuitry.

9. The power supply detect circuit of claim 8, wherein the first circuit further comprises:
a logic gate having an input coupled to an output of each flip flop element and an output; and
a transistor having a control terminal coupled to the output of the logic gate, and a conduction terminal coupled to the output signal of the first circuit.

10. The power supply detect circuit of claim 9, wherein:
the first circuit further comprises a latching circuit coupled to the conduction terminal of the transistor for maintaining a logic state of the output signal of the first circuit when the transistor is shut off.

11. The power supply detect circuit of claim 4 wherein the shift register circuitry comprises:
a first shift register including a plurality of flip flop elements and operating to assert a first signal when the output of the comparator remains in the first logic state substantially entirely over a plurality of consecutive time periods;

a second shift register including a plurality of flip flop elements and operating to assert a second signal when the output of the comparator remains in a second logic state substantially entirely over a plurality of consecutive time periods; and driver circuitry for driving the output signal of the first circuit based upon the first and second signals.

12. The power supply detect circuit of claim 11, wherein the driver circuitry comprises:

a high side driver having a control terminal coupled to the first signal; and a low side driver having a control terminal coupled to the second signal, the high and low side drivers being adapted for driving the output signal of the first circuit.

13. A method for monitoring an electrical signal, comprising:

receiving a digital signal; and generating an output signal that changes logic state whenever the digital signal changes from one logic state to another logic state and thereafter remains in the changed-to logic state substantially entirely over a predetermined period of time.

14. The method of claim 13, wherein the predetermined period of time is a predetermined number of clock periods.

15. The method of claim 13, further comprising:

initially comparing the voltage appearing on the electrical signal to a reference voltage and generating the digital signal based upon the comparison.

16. The method of claim 13, further comprising:

during times when the digital signal is not in the same logic state substantially entirely over a predetermined period of time, maintaining the output signal in the last logic state the digital signal remained in for a predetermined period of time.

17. The method of claim 13, wherein the step of generating comprises the steps of:

sampling the digital signal at a plurality of sampling times;

generating an internal signal for each sample of the digital signal; and asynchronously controlling the logic level of the most recently generated internal signal based upon the logic level of the digital signal.

18. The method of claim 17, wherein the step of generating the output signal comprises driving the output signal to the logic state upon the logic state of each sample and the logic state of the digital signal being the same.

19. An integrated circuit, comprising:

a noise suppression circuit having an input coupled to receive a first signal that is a digital signal and an output signal that is asserted when the first signal changes from a first logic state to a second logic state and remains in the second logic state substantially entirely over a predetermined period of time, and de-asserted when the first signal changes from the second logic state to the first logic state and remains in the first logic state substantially entirely over a predetermined period of time.

20. The integrated circuit of claim 19, wherein the predetermined period of time at which the first signal is in the asserted state to cause the output signal to transition to the asserted state is substantially the same as the predetermined period of time at which the first signal is in the de-asserted state to cause the output signal to transition to the deasserted state.

21. The integrated circuit of claim 19, wherein:

the noise suppression circuit comprises a first shift register circuit having an asynchronous input and a synchronous input coupled to the first signal.

22. The integrated circuit of claim 21, wherein:

the second circuit further comprises a second shift register circuit having an asynchronous input and a synchronous input coupled to the first signal.

23. The integrated circuit of claim 22, wherein:

the asynchronous input of the second shift register circuit is an asynchronous set input of a first flip flop element of the second shift register circuit.

24. The integrated circuit of claim 22, wherein:

an output signal of the second shift register circuit is driven to a first logic state upon each flip flop element being in the same state, the output signal of the noise suppression circuit being de-asserted upon the output of the second shift register circuit being in the first logic state.

25. The integrated circuit of claim 24, wherein:

an output signal of the first shift register circuit is driven to the second logic state upon each flip flop element being in the same state, the output signal of the noise suppression circuit being asserted upon the output of the first shift register circuit being in the first logic state.

26. The integrated circuit of claim 22, wherein:

the asynchronous input of the first shift register circuit is an asynchronous set input of a first flip flop element of the first shift register circuit.

27. The integrated circuit of claim 19, further comprising:

a compare circuit for comparing a voltage level of an electrical signal to a voltage reference and generating the first signal having a value that is based upon the comparison.

28. A circuit for monitoring an electrical signal, comprising:

means for receiving a digital signal; and means for generating an output signal that changes logic state whenever the digital signal changes from one logic state to another logic state and thereafter remains in the changed-to logic state substantially entirely over a predetermined period of time.

29. The circuit of claim 28, wherein:

during times when the digital signal is not in the same logic state substantially entirely over a predetermined period of time, the means for generating maintains the output signal in the last logic state the digital signal remained in for a predetermined period of time.

30. The circuit of claim 28, wherein the generating means comprises:

means for sampling the digital signal at a plurality of sampling times;

means generating an internal signal for each sample of the digital signal; and means for asynchronously controlling the logic level of the most recently generated internal signal based upon the logic level of the digital signal.

31. The circuit of claim 30, wherein the means for generating the output signal drives the output signal to the logic state upon the logic state of each sample and the logic state of the digital signal being the same.

32. A method of suppressing noise in a signal, comprising:

receiving a digital signal;

upon the digital signal transitioning to a first logic state, counting a period of time the digital signal remains in the first logic state;

upon the digital signal transitioning to a second logic state, counting a period of time the digital signal remains in the second logic state;

upon the digital signal remaining in the first logic state for a first predetermined period of time, driving an output signal to one of the first logic state and the second logic state; and upon the digital signal remaining in the second logic state for a second predetermined period of time, driving the output signal to the other of the first logic state and the second logic state.

33. The method of claim 32, wherein the first predetermined period of time is substantially the same as the second predetermined period of time.

34. A circuit, comprising:

first circuitry for receiving a digital signal, counting a period of time the digit al signal remains in a first logic state upon the digital signal transitioning to the first logic state, and counting a period of time the digital signal remains in a second logic state upon the digital signal transitioning to the second logic state, and second circuitry for generating an output signal that transitions to one of the first logic state and the second logic state upon the digital signal remaining in the first logic state for a first predetermined period of time, and transitions to the other of the first logic state and the second logic state upon the digital signal remaining in the second logic state for a second predetermined period of time.

35. The circuit of claim 34, wherein the first predetermined period of time is substantially the same as the second predetermined period of time.

36. The circuit of claim 34, further comprising third circuitry for receiving a second signal, comparing the second circuit to a reference signal and generating the digital signal having a value representative of the comparison.

37. The circuit of claim 34, wherein the first circuitry comprises a first counter for counting when the digital signal transitions to the first logic state, and a second counter for counting when the digital transitions to the second logic state.

38. The circuit of claim 37, wherein the first and second counters are shift registers.

39. The circuit of claim 34, wherein the first circuitry comprises a first shift register.

40. The circuit of claim 39, wherein the first circuitry further comprises a second shift register, the first shift register counts when the digital signal transitions to the first logic state, and the second counter counts when the digital transitions to the second logic state.

* * * * *